(12) United States Patent
Cader et al.

(10) Patent No.: US 9,658,662 B2
(45) Date of Patent: May 23, 2017

(54) RESOURCE MANAGEMENT FOR DATA CENTERS

(75) Inventors: Tahir Cader, Liberty Lake, WA (US); Ratnesh Kumar Sharma, Fremont, CA (US); Cullen E. Bash, Los Gatos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 550 days.

(21) Appl. No.: 13/876,399

(22) PCT Filed: Oct. 12, 2010

(86) PCT No.: PCT/US2010/052381
§ 371 (c)(1),
(2), (4) Date: Mar. 27, 2013

(87) PCT Pub. No.: WO2012/050568
PCT Pub. Date: Apr. 19, 2012

(65) Prior Publication Data
US 2013/0190941 A1    Jul. 25, 2013

(51) Int. Cl.
*G05D 9/00*    (2006.01)
*G05D 5/00*    (2006.01)
*G05D 17/00*   (2006.01)
*G05D 23/00*   (2006.01)
*G06F 1/20*    (2006.01)
(Continued)

(52) U.S. Cl.
CPC ............... *G06F 1/206* (2013.01); *G06F 1/20* (2013.01); *G06F 1/266* (2013.01); *H05K 7/20836* (2013.01); *G06F 2200/201* (2013.01); *Y02B 60/1275* (2013.01)

(58) Field of Classification Search
CPC . G06F 1/206; G06F 1/266; G06F 1/20; G06F 2200/201; H05K 7/20836; Y02B 60/1275
USPC ................... 700/90, 286, 295; 361/690–695
See application file for complete search history.

(56) References Cited

U.S. PATENT DOCUMENTS 7,210,048 B2   4/2007  Bodas
2003/0067745 A1*  4/2003  Patel et al. .................... 361/690
(Continued)

FOREIGN PATENT DOCUMENTS

CN    101595770    12/2009
CN    101769262    7/2010
WO    WO-2010019517    2/2010

OTHER PUBLICATIONS

Accurately Measuring Data Center Power Efficiency; Sun Microsystems (U.A.E) Ltd. I www.sun.com; http://www.nextgenpe.com/article/Accurately-Measuring-Data-Center-Power-Efficiency; Jul. 15, 2011.
(Continued)

*Primary Examiner* — Ziaul Karim
(74) *Attorney, Agent, or Firm* — Trenner Law Firm, LLC (57) ABSTRACT

Resource management for data centers is disclosed. In an exemplary embodiment, a method includes determining electrical power usage for the data center, and determining cooling fluid usage for the data center. The method also includes processing a resource utilization cap for the data center, and adjust ng at least one of the electrical power and the cooling fluid for the data center based on the resource utilization cap.

9 Claims, 5 Drawing Sheets

(51) Int. Cl.
*G06F 1/26* (2006.01)
*H05K 7/20* (2006.01)

(56) References Cited

U.S. PATENT DOCUMENTS

| | | | | |
|---|---|---|---|---|
| 2003/0193777 | A1* | 10/2003 | Friedrich | G06F 1/206 361/679.53 |
| 2003/0200050 | A1* | 10/2003 | Sharma | 702/132 |
| 2004/0141542 | A1* | 7/2004 | Sharma et al. | 374/141 |
| 2005/0278069 | A1* | 12/2005 | Bash | F24F 11/0009 700/276 |
| 2005/0278070 | A1* | 12/2005 | Bash | H05K 7/20836 700/276 |
| 2008/0266794 | A1 | 10/2008 | Malone | |
| 2009/0132097 | A1 | 5/2009 | Sharma et al. | |
| 2009/0138313 | A1 | 5/2009 | Morgan et al. | |
| 2009/0235097 | A1 | 9/2009 | Hamilton et al. | |
| 2009/0327012 | A1 | 12/2009 | Sharma et al. | |
| 2010/0041327 | A1 | 2/2010 | Desler | |
| 2010/0191998 | A1* | 7/2010 | Moore | G06Q 10/06 713/340 |
| 2010/0307171 | A1* | 12/2010 | Hamann | F25B 25/00 62/77 |
| 2011/0082599 | A1* | 4/2011 | Shinde | H02J 13/0003 700/295 |
| 2011/0132579 | A1* | 6/2011 | Best | H05K 7/20763 165/104.31 |

OTHER PUBLICATIONS

Jeff Stein; Waterside Economizing in Data Centers: Design and Control Considerations: http://www.taylor-engineering.com/downloads/articles/ASHRAE-Symposium%20WSE%20in%20Data%20Centers%20Stein.pdf > Publication Date: 2009; vol. 115; On pp. 192-200.

IPO, Examination Report mailed Apr. 11, 2016, GB App. No. 1305932.4, 3, pps.

* cited by examiner

RESOURCE MANAGEMENT FOR DATA CENTERS

BACKGROUND

Electronic data centers including multiple computer systems (e.g., rack-mounted servers) and other electronic devices are becoming more densely packed to provide more computing power while at the same time consuming less physical space. Accordingly, heat dissipation continues to be a concern. If not properly dissipated, heat generated during operation can shorten the life span of various components and/or generally result in poor performance.

Various thermal management systems are available for computer systems and other electronic devices, and include use of water-cooled systems. With these systems, water management both inside and outside the data center is increasingly critical for data center operators. Within the data center, generation and transport of chilled water results in the consumption of roughly one-third of the total energy consumption for a typical data center. Chilled water treatment is also expensive. Outside of the data center, particularly for data centers that utilize evaporative cooling towers, water loss is mounting along with the increase in data center power consumption.

Water is becoming an increasingly important commodity for data centers, particularly in drought-ravaged areas such as western states including California, which also have high density of data centers. In some regions, water scarcity may eventually lead to water caps (similar to power caps currently being implemented by some utilities) by the local water utilities and/or government/regulatory bodies. In order to operate within parameters specified by the water caps, data centers are going to have to better manage their operations, including actively managing their water consumption.

Data centers are increasingly sophisticated in their management of power and cooling resources. But in general, data centers focus on managing the water flow rate to meet specified temperature rises or pressure drops over the heat exchangers in order to meet facilities specifications. Water management at data centers remains separate from the power, cooling, and workload management. The current management schemes do not contemplate resource utilization caps.

DETAILED DESCRIPTION

Briefly, cooling systems and methods may be implemented to dissipate heat during operation of various computing and electronic devices, such as in the rack-mount environment commonly used by data centers. As used herein, the term "data center" is intended to be broadly defined, and may include anything that provides the infrastructure to operate electronics equipment, including a "permanent" facility or a modular or mobile data center. Water, both chilled and non-chilled, as a resource is becoming increasingly important to manage. The data center that successfully manages water as a resource will have a significant advantage over the competition.

The systems and methods disclosed herein address water management in data centers by matching cooling demand to the appropriate volume and delivery of water. This approach negates the need to overprovision for chilled water that is otherwise experienced by keeping the chiller plant running at high capacity regardless of actual need.

The systems and methods may also be utilized to respond to water caps. Water availability at the cooling tower dictates the chilled (or non-chilled) water capacity/availability within the data center. Accordingly, power caps can be imposed upon racks within the data center, and workload can be managed in order to match the overall data center power demand to the overall ability to deliver chilled (or non-chilled) water to the racks.

Also in an example scenario in which data center operators are good at managing their resources, such that they can operate under a cap set by a utility, it is possible that this "excess cap" could be re-sold on the open market or otherwise to data center operators that are not as good at managing their resources (or otherwise have higher demand). This could be akin to a data center buying credits to allow them to exceed their cap.

Exemplary embodiments disclosed herein include in a so-called "bottom up" approach, and so-called "top down" approach. The bottom up approach addresses distribution of water in the datacenter in response to actual need for cooling (e.g., how much heat is being generated). The top down approach addresses water caps which limit the amount of cooling which can occur (and thus the data center operations). The top down approach also addresses loss of water due to heat rejection in the cooling towers. That is, large data centers that have evaporating cooling towers may lose millions of gallons of water to evaporation annually. This loss is expensive, and unsustainable.

Figure 1:
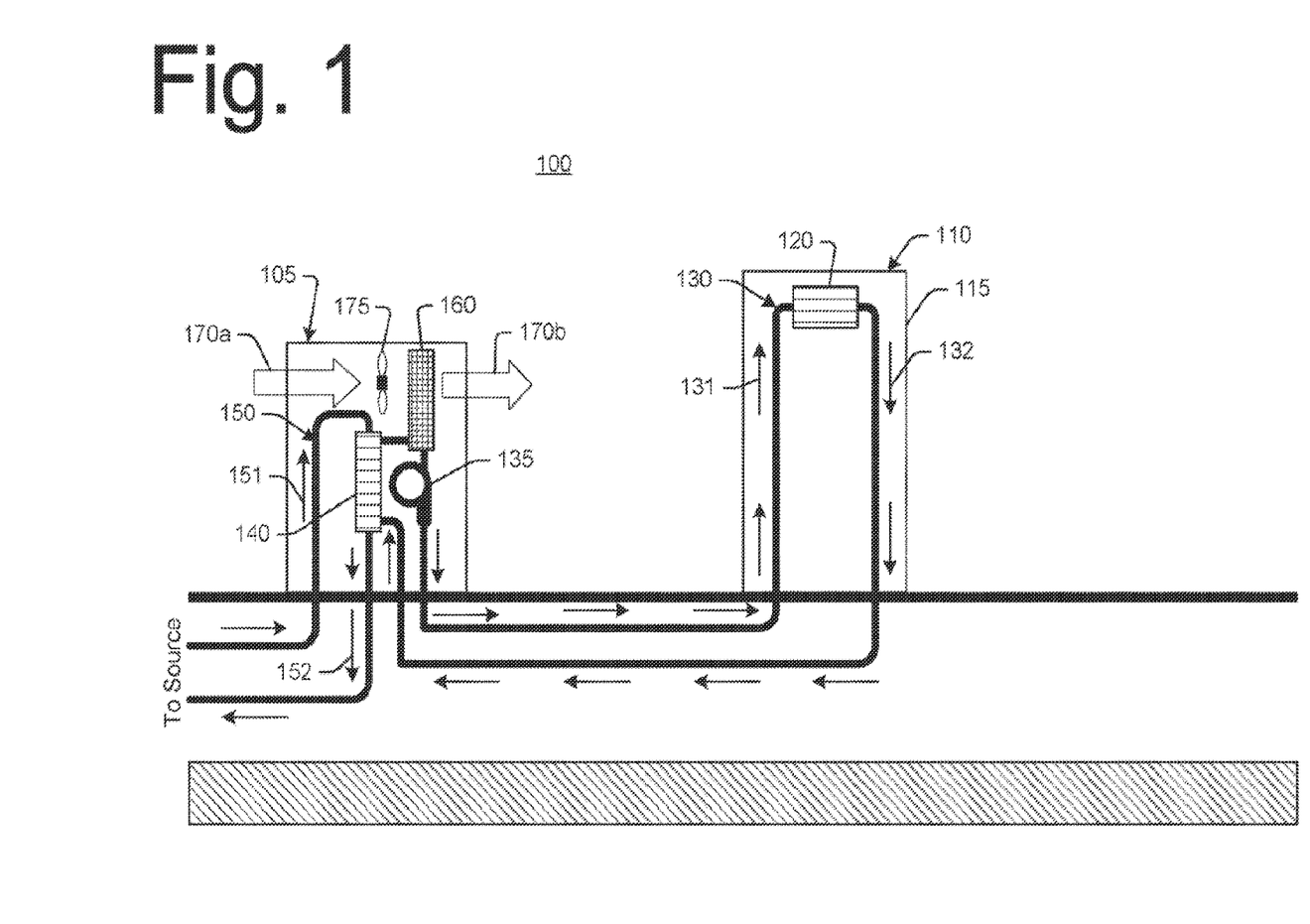
FIG. 1 is a cross-sectional side view of an exemplary cooling system as it may be implemented at a data center including a rack-mount environment for server computers.

FIG. 1 is a cross-sectional side view of an exemplary cooling system 100 as it may be implemented at a data center including a rack-mount 110 environment for server computers. Exemplary cooling systems 100 may include a cooling unit 105 (e.g., a cooling tower) with a plurality of cooling medium (e.g., water), and may implement redundant cooling operations. In redundant cooling operations, if one of the cooling sources fails, is taken offline, or is otherwise unavailable, the remaining cooling source may continue to provide sufficient cooling to prevent a partial or even complete shut down of the computing and/or other electronic devices. Such a configuration may help reduce the likelihood of a failure that cripples the entire system.

Of course the rack-mount environment is shown only for purposes of illustration. The systems and methods described herein are not limited to use with any particular physical environment. The systems and methods also are not limited to use with any particular type of computers or other electronic devices. For example, a rack-mount 110 may be provided with many servers and/or a stand-alone server may sit on the raised floor.

In an exemplary embodiment, a plurality of computer systems and/or other electronic devices (not shown, but readily understood in the computer arts) may be arranged in a rack or rack-mount 110. The rack-mount 110 may include an outer enclosure or housing 115. The server computers are typically arranged within the housing 115 in a stacked relation relative to one another. Of course, a wide variety of other types of rack-mount environments are also commercially available. For example, larger rack-mount environments enable the server computers to be arranged in a stacked relation and a side-by-side relation relative to one another.

As is well-known, server computers typically include one or more processing units or processors, data storage, and/or memory. Server computers may also be operatively associated with other electronic components, such as, communication and networking devices (routers, switches, hubs), and a wide variety of input/output (I/O) devices, which may also be arranged in the rack-mount 110.

During operation, the server computers and other electronic components may generate heat. Accordingly, the cooling system 100 may be implemented to absorb and remove heat from the rack-mount 110. In an exemplary embodiment, the cooling system 100 includes one or more cooling element 120 such as a cold plate located near or adjacent the components generating the heat (not shown, but typically mounted in housing 115 as described above). The cooling element 120 functions to absorb heat generated by the various heat-generating components.

In an exemplary embodiment, the cooling element 120 is made for a fluid to flow through it and is mounted to a heat source (e.g., a processor) for quickly and efficiently absorbing heat. It is noted that there exist many different types of cooling elements, and the systems and methods described herein are not limited to any particular type of cooling elements.

During operation, a cooling fluid (e.g., water or other liquid) may be circulated through lines 130 (e.g., via pump 135) to remove heat absorbed by the cooling element 120, as illustrated by arrow 131 (cool fluid) and arrow 132 (warmed fluid). The warmed fluid may pass through at least one heat exchanger in the cooling unit 105 to be cooled before being re-circulated to the rack-mount 110. It is noted that the heat exchanger functions to transfer heat from one medium to another (e.g., between fluids) while physically isolating the cooling mediums.

In an exemplary embodiment, a first heat-removing element may be implemented, such as heat exchanger 140, provided to thermally connect the warmed fluid with a primary coolant circulated through lines 150, as illustrated by arrow 151 (cool fluid) and arrow 152 (warmed fluid). For example, the primary coolant may be chilled water or other liquid delivered to the first heat exchanger 140 by the building's water supply or other source. A second heat-removing element, such as heat exchanger 160, may be provided to thermally connect the warmed fluid (in lines 130) with a secondary coolant. For example, the secondary coolant may be air (illustrated by arrows 170a, 170b) circulated through the second heat exchanger 150 by fan or blower 175 to remove heat to the surrounding environment (e.g., outside of the cooling unit 105).

Of course the heat-removing elements are not limited to heat exchangers, and may include thermodynamic cycles, by way of example, compressor-based refrigeration, or other suitable components. It is also noted that in exemplary embodiments, the liquid may be the primary heat remover and the fan 175 is only be turned on during an emergency. Although the systems and methods described herein are not limited to such an implementation.

It is noted that although only primary and secondary coolants are shown, each having separate heat exchangers, any number may be implemented. In addition, the systems and methods are not limited to a one-to-one correspondence of heat exchanger to coolant. In other embodiments, for example, the same heat exchanger may be used with alternate coolants. The specific implementation may depend on any of a wide variety of different design considerations, such as, the heat being generated, the desired cooling, and the surrounding environment, to name only a few examples.

It is noted that any of a wide variety of configurations of the cooling system 100 may be implemented to accomplish these and other advantages. Some examples of different configurations include additional or backup heat exchangers that may also be provided to thermally connect the warmed fluid with a secondary coolant. The secondary coolant may be air (or a refrigerant) circulated through the heat exchangers by fans or blowers in the rack mounts to remove heat to the surrounding environment.

In another embodiment, control valves may be provided at various locations on the fluid lines. For example, shut-off valves may be provided on fluid lines in the rack-mount. During operation, shut-off valves may be opened and closed to bring the primary and secondary coolants online/offline. Other control valves may be used to turn on to re-circulate the warmed cooling fluid locally for cooling by airflow. In this way, the system may continue to operate even when heat exchangers are being serviced or replaced. Of course, the valves may be manually operated, or automatically operated based on input or feedback from a monitoring/management system (e.g., for sensing failures).

It is noted that the exemplary embodiments discussed above are provided for purposes of illustration and are not intended to be limiting. For example, any number and/or types of coolant may be provided with heat exchangers in any of a wide variety of different configurations. In addition, operations may be detected automatically by the building monitoring system and/or with sensors (e.g., pressure, flow, temperature sensors) included as part of the cooling system itself to open/close valves, etc. Furthermore, the systems and method described herein for managing resources in a data center are not limited to a single facility, but may be utilized among multiple facilities either owned by the same data center operator, or groups of data center operators.

Still other embodiments are also contemplated. For example, although the systems and methods are described with reference to computer systems, in other exemplary embodiments, the cooling systems may be implemented for other electronic devices, such as, e.g., video and audio equipment, etc. The use of the term "data systems" herein is intended to encompass computer systems and/or other electronic systems regardless of whether any data is actually being processed.

Figure 2:
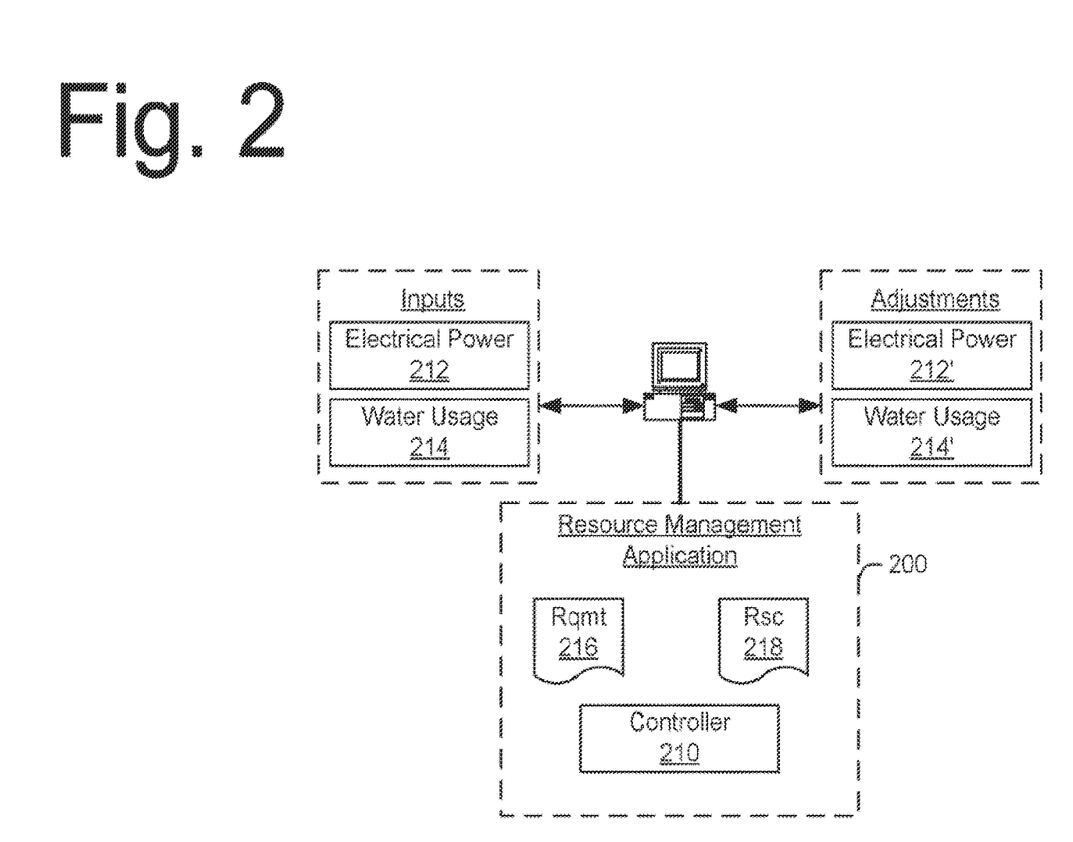
FIG. 2 is a high-level block diagram of an exemplary resource management system for a data center.

FIG. 2 is a high-level block diagram of an exemplary resource management system 200 for a data center. The resource management system 200 may be implemented in program code, including but not limited to, computer software, web-enabled or mobile applications or "apps", so-called "widgets," and/or embedded code such as firmware. Although the program code is shown in FIG. 2 comprising a number of components or modules for purposes of illustration herein, the program code is not so limited. The program code may include additional components, modules, routines, subroutines, etc. In addition, one or more functions may be combined into a single component or module.

It is noted operation of the heat-generating components is constrained by the ability of the cooling system to dissipate heat. Accordingly, power and/or water utilization may be automatically adjusted so as to prevent the occurrence of performance degradation and/or outright failures resulting in a complete shutdown. In some circumstances, at least some of the components (e.g., critical servers) may continue to operate at full power while use of other components (e.g., to alternate or backup systems) is reduced or even turned off to meet these constraints.

In an embodiment, the resource management system 200 may include a controller interface 210 operatively associated with at least one of inputs 212 for electrical power and inputs 214 for cooling fluid for the data center. The resource management system 200 may also include a requirements manager 216 configured to process a resource utilization cap for the data center. A resource manager 218 is operatively associated with the requirements manager 216 and the controller interface 210. The resource manager 218 configures output of the controller interface 210 to adjust at least one of the electrical power 212' and the cooling fluid 214' for the data center based on the resource utilization cap as explained in more detail below with reference to the embodiments shown and described for FIGS. 2a and 2b.

Figure 2A:
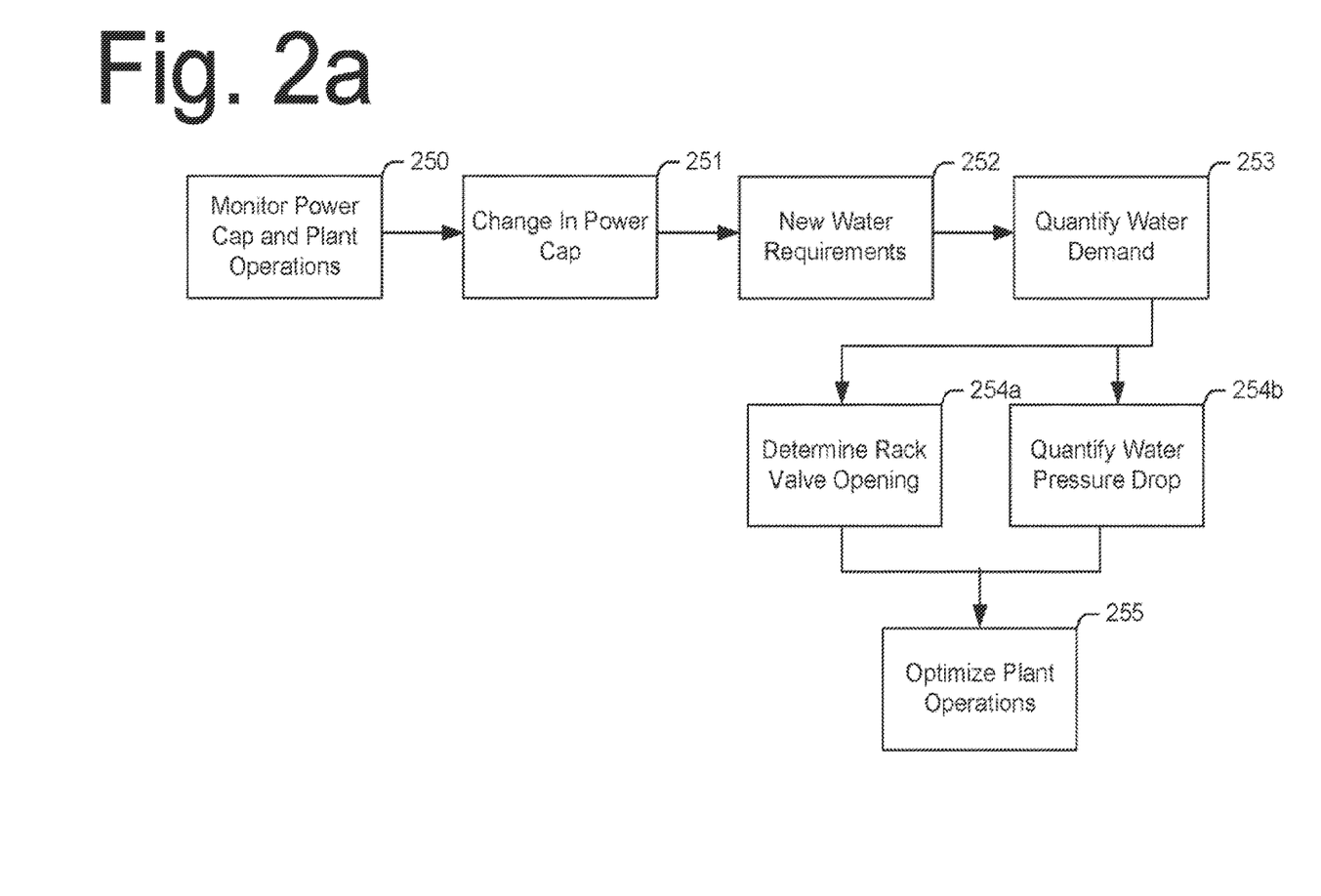
FIG. 2a is a workflow diagram illustrating exemplary water provisioning at a data center according to a "bottom up" approach.

FIG. 2a is a workflow diagram illustrating exemplary water provisioning at a data center according to a "bottom up" approach, e.g., based on actual power consumption or power caps. A water provisioning capability is included in the management software, and water flow rate to a rack may be capped by controlling the rack water valves. In en embodiment, a power cap may be set for one or more rack at the data center. The flow rate for that rack may then be determined (e.g., using a look-up table or suitable algorithm), and the water delivery plant (chilled and non-chilled) operations can be optimized. By way of example, if 300 kW of cooling capacity is needed from a chilled water plant that has 600 kW of capacity, one or more of the chillers can be shut down in order to better match the data center's needs with output by the chiller plant. Water (loss/consumption) due to evaporation will also depend on the chilled water temperature, indirectly. Lower chilled water temperature requires higher power consumption in the chiller which leads to higher water consumption in the cooling towers. Of course, this will vary based on type of chillers/cooling tower.

In this example, the water is chilled and the data center is deploying water-cooled racks. At 250, all rack power caps are known, the chiller plant operations are known (including at least the chilled water pumps, chillers, condenser pumps, and cooling towers), and the data center is operating at steady-state. At 251, management software predicts an upcoming change in workloads for which new power caps are set. It is noted that the management software may measure change in addition to, or instead of predicting change. At 252, the management software determines the new water requirement for each rack. At 253, the management software quantifies the total data center cooling demand, which translates to water demand. At step 254a-b the management software determines the rack valve opening, and quantifies the total water pressure drop in the data center. At 255, the management software uses water demand and pressure drop information to help optimize chiller plant operation.

Figure 2B:
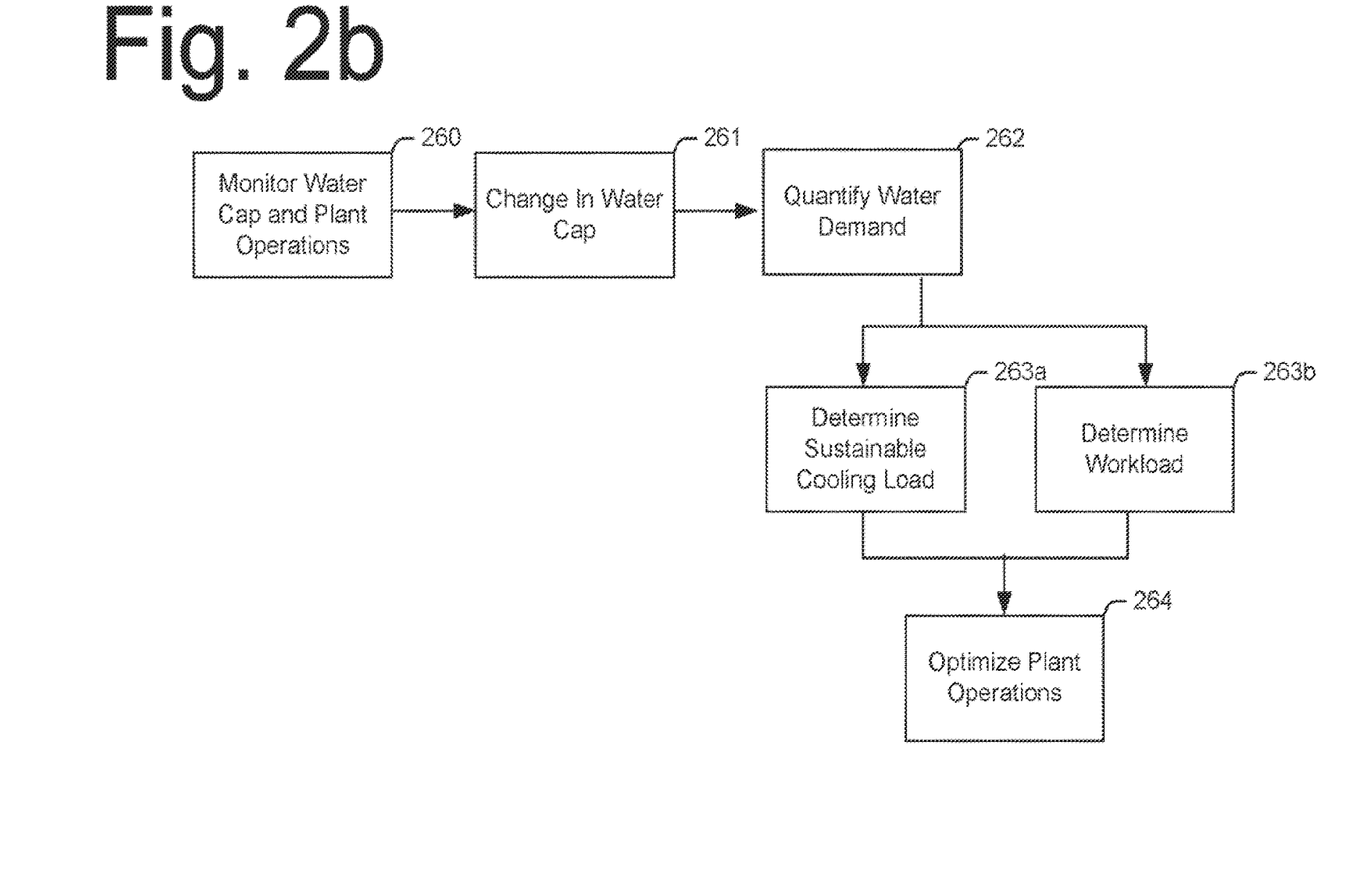
FIG. 2b is a workflow diagram illustrating exemplary water provisioning at a data center according to a "top down" approach.

FIG. 2b is a workflow diagram illustrating exemplary water provisioning at a data center according to a "top down" approach, e.g., based on water caps. A water cap may be imposed, for example, if a utility predicts that during a given time it will not be able to meet the forecast demand for its service territory. The utility may request its customers to reduce utilization to bring the demand in line with capacity. These restrictions on water use could drive power capping thresholds at the server, rack or zone level. To the extent that a data center cannot or will not respond to a request to reduce water usage, the utility may cap the water that it delivers to that data center. The data center that is able to minimize its water usage will have a competitive advantage relative to its competitors.

It is noted that "water usage" or "cooing fluid usage" as used herein is intended to include flow rate, a combination of flow rate and water temperature, and cooling capacity (which is directly related to flow rate and temperature). Usage may be controlled in any of a wide variety of methods, including, for example, controlling flow rate, flow volume, controlling water temperature (e.g., using a supplemental coolant such as a refrigerant or air), and/or a combination thereof.

In this example, the data center is deploying water-cooled cooling towers, and air-cooled or water-cooled racks. At 260, all water caps and data center power demand are known and matched, and the data center is operating at steady-state. At 261, the management software receives a request from the utility for a 10% reduction in water use over a specified time. In operation 262, the management software determines the water demand in the data center, and compares this to the cap requested by the utility. The demand may call for a 10% reduction in water use. For example, the data center may receive incentive payments from the utility after the chiller plant operation is adjusted accordingly.

In operations 263a-b, the current water demand exceeds the water availability after accounting for a 10% reduction in water availability. The management software determines the cooling load that can be sustained. Sequentially, the management software determines a suitable workload to reduce in order to match the cooling demand to the cooling capacity available. In operation 264, power caps and chiller plant operations are determined based on the water caps.

Apart from delivery constraints, embedded energy in water can be calculated from data center monitoring systems to determine the direct and indirect energy impact of water consumption during operation. This can be used as a determinant to switch to water efficient technologies, while still maintaining the desirable coefficient of performance of the datacenter and emission levels.

Figure 3:
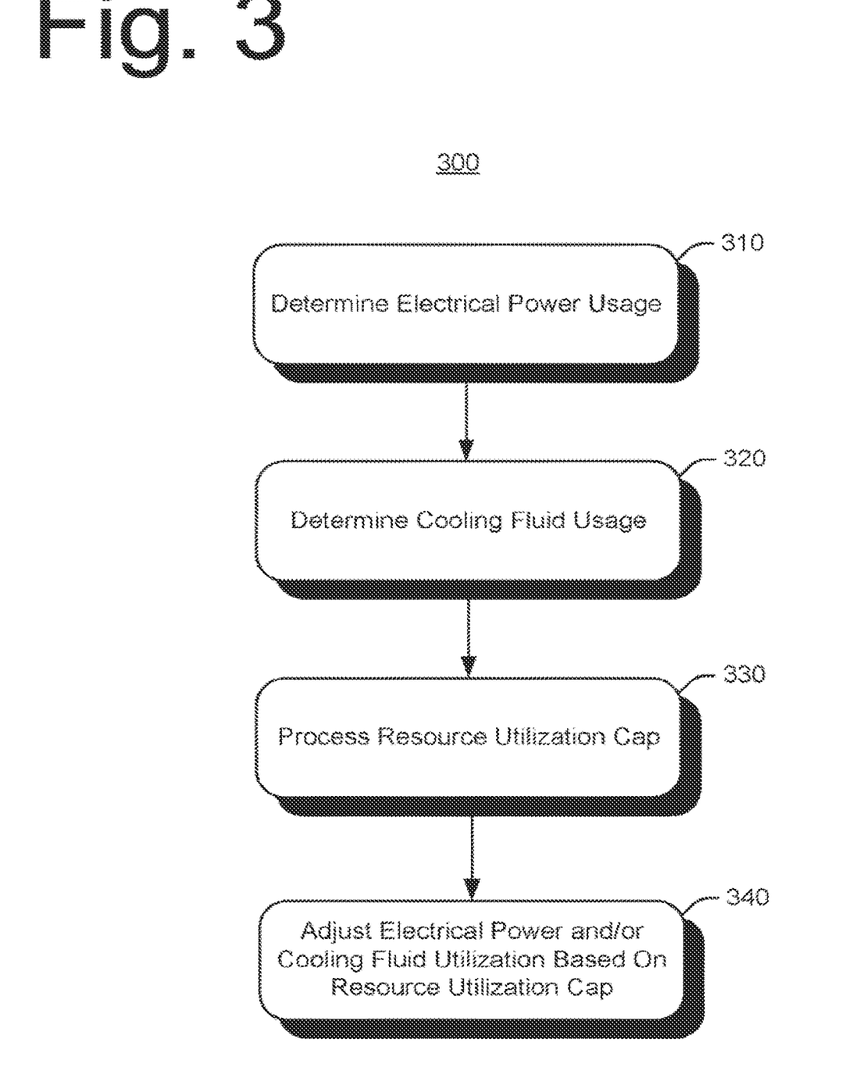
FIG. 3 is a flowchart illustrating exemplary operations for managing resources for a data center.

FIG. 3 is a flowchart illustrating exemplary operations for managing resources for a data center. Operations 300 may be embodied as logic instructions (e.g., firmware) on one or more computer-readable medium. When executed by a processor, the logic instructions implement the described operations. In an exemplary implementation, the components and connections depicted in the figures may be utilized.

In operation 310, electrical power usage is determined for the data center. In operation 320, cooling fluid usage is determined for the data center. It is noted, however, that operations 310 and 320 should not be construed as implying any particular ordering of these operations. In another example, cooling fluid usage may be determined before electrical power usage is determined. In yet-another example, cooling fluid usage and electrical power usage may be determined substantially at the same time. It is also noted that the terms "determine," "determined," and "determining" are intended to be construed sufficiently broadly as to include receiving input from an outside source (e.g., user input and/or electronic monitoring), and may also include additional processing and/or formatting of various data from one or more sources.

In operation 330, a resource utilization cap is processed for the data center. The resource utilization cap may be an electrical power cap and/or a water usage cap. The resource utilization cap may be set internally (e.g., based on an internal resource usage policy for reducing consumption and/or budget reasons). The resource utilization cap may also be set externally (e.g., based on mandates by the utility company, regulations, and so forth). The resource utilization cap may also be negotiated, e.g., between the data center operator (or among multiple data center operators) and/or the utility company or various regulatory bodies.

The resource utilization cap may also be set for a single facility or multiple facilities. For example, the resource utilization cap may be set for multiple facilities owned by the same data center operator. Or for example, the resource utilization cap may be set for multiple facilities within the jurisdiction of a single utility company.

Processing the resource utilization cap may include receiving the resource utilization cap (e.g., internally or externally). Processing the resource utilization cap may also include adjusting the resource utilization cap, for example, by a factor of safety or a threshold so as to provide a suitable response time before the resource utilization cap is exceeded.

In operation 340, at least one of the electrical power and the cooling fluid for the data center are adjusted based on the resource utilization cap. In one example, the electrical power usage may be adjusted up or down based on the amount of cooling fluid that is available. In another example, the cooling fluid usage may be adjusted up or down based on the electrical power usage. Combinations thereof are also contemplated.

The operations shown and described herein are provided to illustrate exemplary embodiments for reimaging a multi-node storage system. It is noted that the operations are not limited to the ordering shown and other operations may also be implemented.

By way of further illustration, the method may also include adjusting delivery of electrical power to one or more heat-generating components in the data center to satisfy the resource utilization cap. The method may also include configuring usage of one or more heat-generating components in the data center to satisfy the resource utilization cap.

For example, the method may include timing the usage of one or more heat-generating components in the data center to satisfy the resource utilization cap. Timing may include bringing more heat-generating components online during off-peak hours and taking resources offline during peak hours of operation. Timing may also include adjustments for daily (e.g., day versus nighttime) and seasonal (e.g., summer versus winter) operations.

In another example, the method may include aggregating usage of one or more heat-generating components in the data center to satisfy the resource utilization cap. Aggregating may include bringing heat-generating components online in one or more thermal boundary of the data center so that less cooling fluid is needed than if cooling fluid had to be delivered across multiple thermal boundaries. Operating at higher chilled water temperatures can also help managing the water consumption.

By way of yet further illustration, the method may also include adjusting flow of a cooling fluid to satisfy the resource utilization cap. Row may be decreased as a consequence of fewer heat-generating components being online; and increased only when more heat-generating components are online. Likewise, fewer heat-generating components may be brought online as a consequence of reduced flow; and more heat-generating components may be brought online only when flow can be increased.

In another example, the method may include utilizing a secondary coolant (e.g., air or refrigerant) to satisfy the resource utilization cap. The secondary coolant may be used in addition to, or in place of at least a portion of the cooling fluid.

In addition to the specific embodiments explicitly set forth herein, other aspects and embodiments will be apparent to those skilled in the art from consideration of the specification disclosed herein. It is intended that the specification and illustrated embodiments be considered as examples only.

The invention claimed is:

1. A computer-implemented method of managing resources for a data center, comprising:
   determining electrical power usage for the data center;
   determining cooling fluid usage for the data center;
   predicting a change in workload;
   based on the predicted change in workload, processing a resource utilization cap associated with the electrical power and a primary coolant for the data center, wherein the resource utilization cap includes:
      an electrical power cap associated with the electrical power; and
      a water usage cap associated with the primary coolant;
   dynamically configuring a cooling fluid controller during operation of the data center to adjust use of the primary coolant by determining a primary coolant valve opening or identifying a water pressure drop to satisfy the resource utilization cap, wherein the primary coolant is water;
   dynamically configuring a secondary coolant controller during operation of the data center to adjust use of the secondary coolant in place of at least a portion of the primary coolant for the data center based on the resource utilization cap, wherein the secondary coolant is air; and
   dynamically configuring an electrical power controller during operation of the data center to adjust electrical power usage by one or more heat-generating components in the data center to satisfy the resource utilization cap, wherein adjusting electrical power usage includes turning on the heat-generating components in a same rack and turning off the heat-generating components in another rack.

2. The computer-implemented method of claim 1 further comprising timing usage of one or more heat-generating components in the data center to satisfy the resource utilization cap.

3. The computer-implemented method of claim 1 further comprising adjusting flow of a cooling fluid to satisfy the resource utilization cap.

4. The computer-implemented method of claim 1 further comprising adjusting the primary coolant and the secondary coolant and not adjusting the electrical power to satisfy the resource utilization cap.

5. A computer-implemented resource management system for a data center, comprising:
   a controller operatively associated with electrical power and cooling fluid for the data center;
   a requirements manager to process a resource utilization cap that is associated with the electrical power and a primary coolant for the data center and based on a predicted change in workload, wherein the resource utilization cap includes:
      an electrical power cap associated with the electrical power; and a water usage cap associated with the primary coolant; and a resource manager operatively associated with the requirements manager and the controller, the resource manager dynamically configuring output of the controller to:

adjust use of the primary coolant for the data center to satisfy the resource utilization cap by determining a primary coolant valve opening or identifying a water pressure drop, wherein the primary coolant is water;

adjust use of a secondary coolant in place of at least a portion of the primary coolant for the data center based on the resource utilization cap, wherein the secondary coolant is one of air or refrigerant; and adjust electrical power usage by one or more heat-generating components in the data center to satisfy the resource utilization cap, wherein adjusting electrical power usage includes turning on the heat-generating components in a same rack and turning off the heat-generating components in another rack.

6. The system of claim 5 wherein the controller is configured by the resource manager to adjust a cooling fluid usage in at least one cooling element thermally connecting the cooling fluid to one or more heat-generating components so that the cooling fluid absorbs and dissipates heat from the heat-generating components during operation of the data center to satisfy the resource utilization cap.

7. The system of claim 5 wherein the resource utilization cap is at least maximum water usage.

8. The system of claim 5 wherein the resource utilization cap is at least maximum electrical power usage.

9. A resource management system including program code stored on a computer-readable storage and executable by a processor to:

identify electrical power usage and cooling fluid usage for a data center to predict a change in workload;

set a resource utilization cap based on the predicted change in workload, wherein the resource utilization cap is associated with the electrical power and a primary coolant for the data center, the resource utilization cap including:

an electrical power cap associated with the electrical power; and a cooling fluid usage cap associated with the primary coolant; and dynamically configure a cooling fluid controller during operation of the data center to adjust use of the primary coolant to satisfy the resource utilization cap by determining a primary coolant valve opening or identifying a water pressure drop, wherein the primary coolant is a cooling fluid;

dynamically configure a secondary coolant controller during operation of the data center to adjust use of the secondary coolant in place of at least a portion of the primary coolant for the data center based on the resource utilization cap, wherein the secondary coolant is one of water, air, or refrigerant and is different than the primary coolant; and dynamically configure an electrical power controller during operation of the data center to adjust electrical power usage by one or more heat-generating components in the data center to satisfy the resource utilization cap, wherein adjusting electrical power usage includes turning on the heat-generating components in a same rack and turning off the heat-generating components in another rack.

* * * * *